United States Patent [19]

Iwasa et al.

[11] Patent Number: 5,396,120
[45] Date of Patent: Mar. 7, 1995

[54] SEMICONDUCTOR INTEGRATED UNIT

[75] Inventors: Shoichi Iwasa; Kouhei Eguchi, both of Tokyo, Japan

[73] Assignee: Nippon Steel Corporation, Tokyo, Japan

[21] Appl. No.: 113,956

[22] Filed: Aug. 31, 1993

Related U.S. Application Data

[63] Continuation of Ser. No. 866,786, Apr. 6, 1992, abandoned.

[30] Foreign Application Priority Data

Apr. 10, 1991 [JP] Japan .................. 3-104870

[51] Int. Cl.⁶ .......................................... H03K 17/14
[52] U.S. Cl. ........................... 327/512; 327/543; 327/437; 327/427
[58] Field of Search ............... 307/310, 296.1, 296.5, 307/296.8, 451, 571, 580, 585, 633, 362, 363, 296.4, 272.3; 328/3

[56] References Cited

U.S. PATENT DOCUMENTS

| | | | |
|---|---|---|---|
| 4,424,461 | 1/1984 | Taguchi et al. | 307/310 |
| 4,922,133 | 5/1990 | Iwahashi et al. | 307/363 |
| 5,024,535 | 6/1991 | Winston, Jr. | 307/310 |
| 5,046,859 | 9/1991 | Yamaguchi | 307/310 |
| 5,166,546 | 11/1992 | Savignac et al. | 307/363 |

FOREIGN PATENT DOCUMENTS

| | | | |
|---|---|---|---|
| 943642 | 3/1974 | Canada | 307/310 |
| 55-55539 | 4/1980 | Japan . | |
| 58-77329 | 5/1983 | Japan . | |
| 2186143 | 8/1987 | United Kingdom | 307/310 |

OTHER PUBLICATIONS

"Temperature Controlled Static Switching", New Design Ideas from SSPI, 1961.

*Primary Examiner*—John S. Heyman
*Assistant Examiner*—My-Trang Nu Ton
*Attorney, Agent, or Firm*—Pollock, Vande Sande & Priddy

[57] ABSTRACT

A semiconductor integrated circuit device comprising a temperature sensor including an element having a PN junction, an inverter for receiving an output of the temperature sensor, and a controller for controlling supply of an electric energy to a group of MOS integrated circuit elements on the basis of an output of the inverter, wherein the supply of the electric energy to the group of MOS integrated circuit elements is controlled on the basis of the output of the temperature sensor to automatically prevent the breakdown of the internal circuit due to excessive temperature rise by the device itself.

20 Claims, 2 Drawing Sheets

SEMICONDUCTOR INTEGRATED UNIT

This application is a continuation of Ser. No. 07/866,786, filed on Apr. 6, 1992, now abandoned.

BACKGROUND OF THE INVENTION

1. Field of the Invention

The present invention relates to a semiconductor integrated circuit device containing a temperature sensor. 2. Description of the Related Art A method of protecting a semiconductor device from temperature rising, is disclosed for example in JP-A-55-55539. In accordance with this method, the voltage across the emitter and collector of a bipolar transistor having a heat radiating board made of a magnetic substance is monitored to detect the temperature of that bipolar transistor. When the detected temperature rises up to a critical temperature, the magnetic heating is stopped to prevent the breakdown of the transistor due to the excessive temperature rise.

On the other hand, in JP-A-58-77329, there is proposed a semiconductor integrated circuit device in which when a power supply voltage exceeding the operating voltage range is applied, the temperature rise of a PN junction of the transistor constituting an internal circuit is prevented by providing a circuit for suppressing the circuit current by utilizing a reverse breakdown voltage of the PN junction.

However, in the method disclosed in JP-A-55-55539, the detection of the temperature of the semiconductor device and the interruption of the magnetic heating are performed outside, and not within the semiconductor device itself. Further, when the actual reliability test is performed, the semiconductor device is encapsulated in a package and then subjected to the aging. In this connection, different kinds of packages may have different radiating capabilities. Thus, even when the reliability test is performed with a certain kind of package, the rate of temperature rise of the PN junction may be different when it is encapsulated in a different package. Therefore, in this case, an additional work is required to perform the reliability test again for that different package.

On the other hand, in the semiconductor integrated circuit device disclosed in JP-A-58-77329, the circuit for suppressing the circuit current is constructed by bipolar transistors. Therefore, such construction is unsuitable for the MOS type semiconductor integrated circuit device.

SUMMARY OF THE INVENTION

The present invention has been made to solve the above-mentioned problem, and has an object to provide a semiconductor integrated circuit device which is capable of automatically preventing by itself the breakdown due to the excessive temperature rise.

Another object of the present invention is to provide a semiconductor integrated circuit device which is suitable for preventing the breakdown due to the temperature rise of a MOS type semiconductor integrated circuit device.

Still another object of the present invention is to provide a semiconductor integrated circuit device which is capable of, once the reliability test has been performed with any kind of package, preventing the breakdown due to the temperature rise whatever kind of package is used.

In order to attain the above objects of the present invention, there is provided a semiconductor integrated circuit device having a temperature sensor for controlling supply of an electric energy to a group of MOS integrated circuit elements on the basis of a detection output of the temperature sensor, the semiconductor integrated circuit device comprising: the temperature sensor including an element having a PN junction; an inverter to which an output of the temperature sensor is supplied and a controller for controlling supply of the electric energy to the group of MOS integrated circuit elements on the basis of an output of the inverter. The temperature sensor includes a PN junction diode and a resistor connected in series with the PN junction diode. The resistor is further provided at its one end with connection means for connecting it to a power supply. The resistor includes a resistance wire forming a body of the resistor and a contact which is provided at an intermediate point of the resistance wire to define a resistance value of the resistor, and connected to the connection means. The resistor is further provided with a bypass for short-circuiting a part of the resistance wire to reduce the resistance value. The controller includes a MOS transistor. The inverter includes a pair of MOS transistors.

Further, there is provided a semiconductor integrated circuit device having a temperature sensor for controlling supply of an electric energy to a group of MOS integrated circuit elements on the basis of a detection output of the temperature sensor, the semiconductor integrated circuit device comprising: the temperature sensor having a PN junction diode and a resistor connected in series with the PN junction diode; an inverter for receiving an output of the temperature sensor and having a pair of MOS transistors, the output of the temperature sensor being inputted to respective gates of the pair of MOS transistors; and a controller for controlling the supply of the electric energy to the group of MOS integrated circuit elements, the controller including a MOS transistor, the output of the inverter being inputted to a gate of the MOS transistor. Moreover, the resistor of the temperature sensor is provided at its one end with connection means for connecting it to a power supply. The resistor includes a resistance wire forming a body of the resistor and a contact which is provided at an intermediate point of the resistance wire to define a resistance value of the resistor, and connected to the connection means. The resistor is further provided with a bypass for short-circuiting a part of the resistance wire thereby to reduce the resistance value. The pair of MOS transistors of the inverter include a P-channel MOS transistor and an N-channel MOS transistor and connection means is provided to a source of the P-channel MOS transistor for connecting it to a power source. A drain of the P-channel MOS transistor and a source of the N-channel MOS transistor are both connected to the gate of the MOS transistor of the controller. The controller includes a P-channel MOS transistor and connection means is provided to a source of the P-channel MOS transistor for connecting it to the power source. The P-channel MOS transistor of the controller is connected at its drain to the group of MOS integrated circuit elements.

Further, there is provided a semiconductor integrated circuit device having a temperature sensor for controlling supply of an electric energy to a group of MOS integrated circuit elements on the basis of a detection output of the temperature sensor, the semiconductor integrated circuit device comprising: the temperature sensor having a PN junction diode and a resistor connected in series with the PN junction diode, a PN junction diode side of the series connection of the PN junction diode and the resistor being connected to a grounding side, while its resistor side is connected to a power supply side; an inverter for receiving an output of the temperature sensor, and having a pair of P-channel MOS transistor and N-channel MOS transistor, the output of the temperature sensor being inputted to gates of the MOS transistors, a drain of the P-channel MOS transistor and a drain of the N-channel MOS transistor providing an output of the inverter; and a controller for controlling supply of the electric energy to the group of MOS integrated circuit elements on the basis of the output of the inverter, the controller including a P-channel MOS transistor, the output of the inverter being inputted to a gate of the P-channel MOS transistor of the controller, a drain of the P-channel MOS transistor being connected to the group of MOS integrated circuit elements. Moreover, the temperature sensor has an output portion at a connection between the PN junction diode and the resistor. A source of the P-channel MOS transistor of the inverter is further provided with a connection terminal to be connected to a power source. A source of the P-channel MOS transistor of the controller is further provided with a connection terminal to be connected to the power source. The resistor is provided at its one end with connection means to be connected to the power supply. The resistor includes a resistance wire forming a body of the resistor and a contact which is provided at an intermediate point of the resistance wire to define a resistance value of the resistor, and the contact is connected to the connection means. The resistor is further provided with a bypass for short-circuiting a part of the resistance wire to reduce the resistance value.

According to the semiconductor integrated circuit device having the construction as described above, when the temperature of the device rises up to a level higher than a predetermined temperature, the output of the temperature sensor contained in the device is inverted by the inverter and then supplied to the gate of the MOS transistor connected between the internal circuit and the power source thereby to turn off the MOS transistor, whereby the supply of the power to the internal circuit can be automatically stopped. As a result, the breakdown of the internal circuit due to the excessive temperature rise can be automatically prevented by itself.

Moreover, since the breakdown of the internal circuit due to the temperature rise can be automatically preventing by itself, once the reliability test is performed with any kind of package, the breakdown of the internal circuit can be prevented whatever kind of package is used.

Further, since the inverter can be made of the MOS transistors, the semiconductor integrated circuit device is suitable for preventing the breakdown of the MOS type semiconductor integrated circuit device due to the temperature rise.

DESCRIPTION OF THE PREFERRED EMBODIMENTS

One embodiment of the present invention will hereinafter be described with reference to the accompanying drawings.

Figure 1:
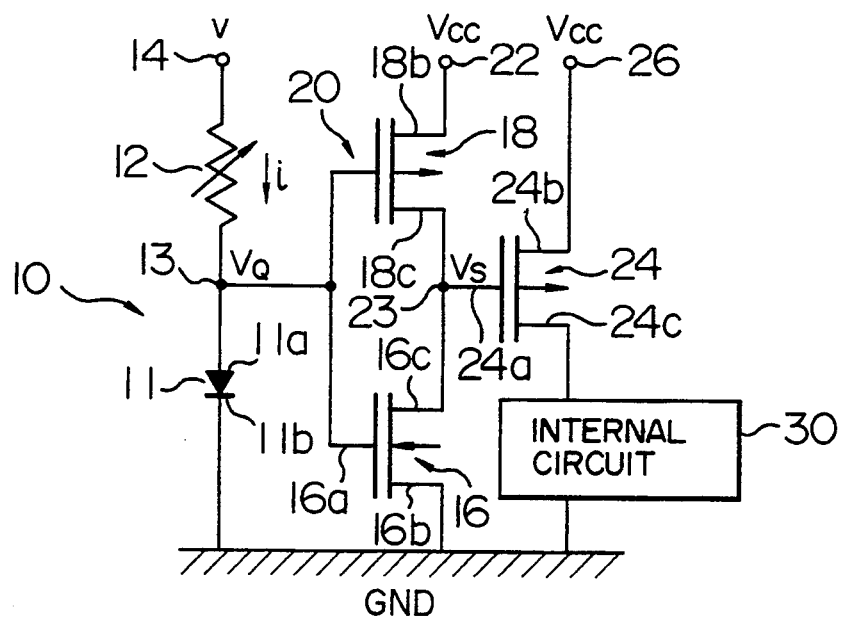
FIG. 1 is a circuit diagram showing the arrangement of a semiconductor integrated circuit device according to one embodiment of the present invention.

FIG. 1 is a circuit diagram showing the arrangement of a temperature sensor system of a semiconductor integrated circuit device according to one embodiment of the present invention.

In the present embodiment, an anode 11a of a PN junction diode 11 acting as a temperature sensor 10 and one end of a resistor 12 (its resistance is represented by R), which is a main heat source for a temperature to be detected by the PN junction diode 11, are connected in series with each other at a contact 13. The other end of the resistor 12 is provided with a power terminal 14 to which a predetermined voltage v (e.g., about 1.0 V) is applied. The power terminal 14 to which the power voltage v is applied is independent of a power terminal of the body of the semiconductor integrated circuit device, i.e., an internal circuit 30 including a memory, a logical circuit and the like which are made of a group of MOS integrated circuit elements. On the other hand, a cathode 11b of the PN junction diode 11 is grounded.

The anode 11a of the PN junction diode 11 is connected at the contact 13 to gates 16a and 18a of an N-channel MOS transistor 16 and a P-channel MOS transistor 18 constituting an inverter 20. In this connection, a power voltage Vcc is applied to a source 18b of the P-channel MOS transistor 18 through a power terminal 22 of the internal circuit 30. Moreover, a source 16b of the N-channel MOS transistor 16 is grounded. Drains 16c and 18c of the N-channel MOS transistor 16 and the P-channel MOS transistor 18 constituting the inverter 20 are connected to each other at a contact 23, and to a gate 24a of a P-channel MOS transistor 24. The P-channel MOS transistor 24 which constitutes switching means which is connected in series between the internal circuit 30 and a power supply (Vcc) for the internal circuit 30. The power voltage Vcc is applied through a power terminal 26 to a source 24b of the P-channel MOS transistor 24, of which a drain 24c is connected to the internal circuit 30. A part of the internal circuit 30 is also, as shown in FIG. 1, grounded. The internal circuit 30 is made up of a memory, a logical circuit and the like which are made of a group of MOS integrated circuit elements.

Figure 2:
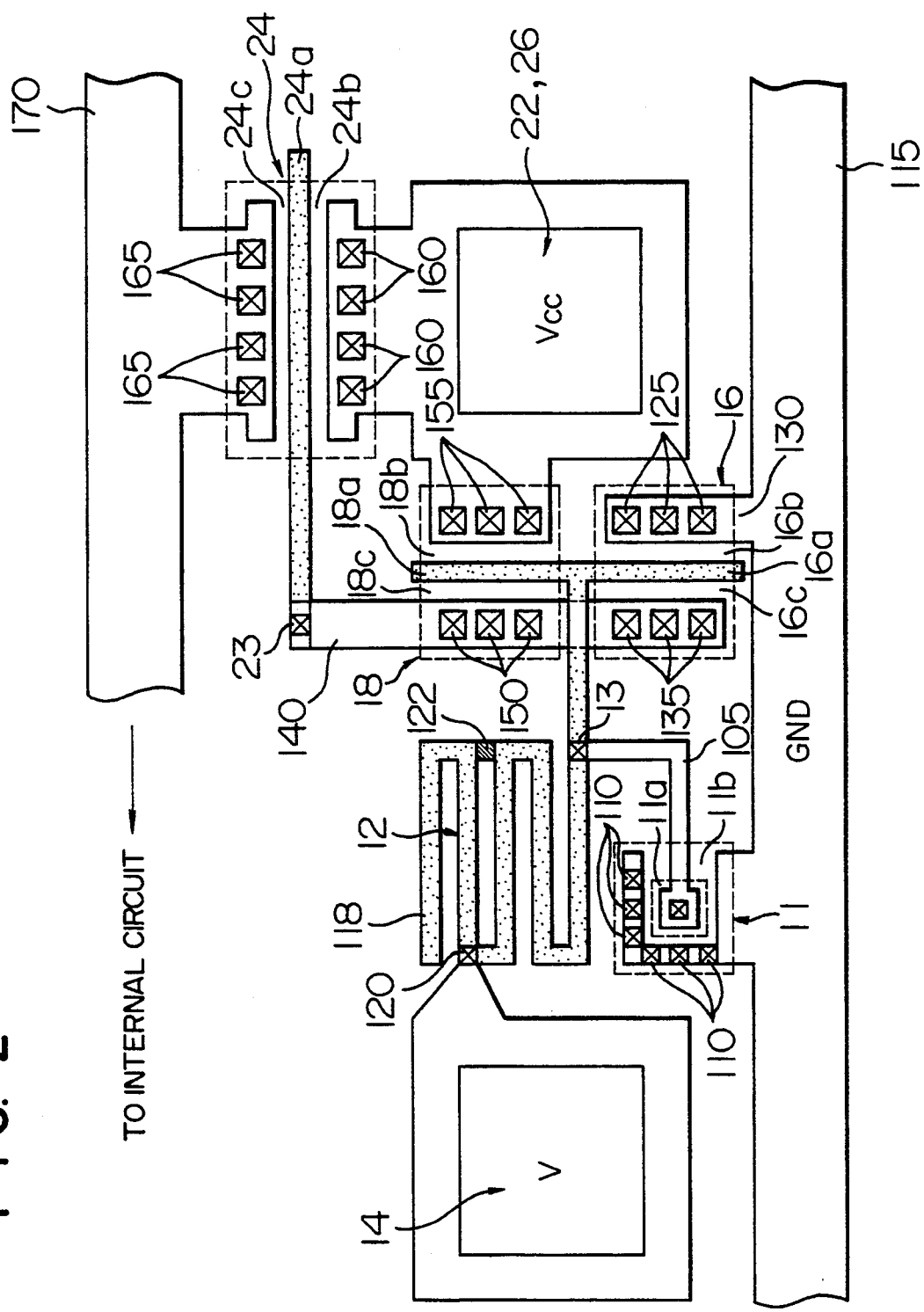
FIG. 2 is a plan (top) view showing the layout on a substrate of the arrangement shown in FIG. 1.

FIG. 2 is a plan view showing the layout on a semiconductor wafer of the circuit arrangement shown in FIG. 1. This circuit wiring is normally formed on a semiconductor substrate such as a silicon substrate. The typical components on the layout corresponding to those of the circuit of FIG. 1 are represented by the same reference numerals. The PN junction diode 11 has the anode 11a located in the center portion thereof and the cathode 11b having a size larger than that of the anode 11a. The anode 11a is connected at the contact 13 to the resistor 12 through a lead 105. Moreover, the cathode 11b is connected through contacts 110 adjacent to the anode 11a to a grounding conductor 115. The resistor 12 is constructed by a resistance wire 118 made of polysilicon, one end of the resistor 12 is connected at the contact 13 to the diode 11 and the other end thereof is connected at a contact 120, which is formed at a position selected so as to provide a desired resistance value, to an electrode 14 made of aluminium. The resistance wire 118 of the resistor 12 extends on the wafer with a length so that the resistance of the resistor 12 is variable by changing the position of the contact 120 or providing a bypass 122 at a part thereof for short circuiting a part of the resistor wire 118 to reduce the resistance value of the resistor 12, when manufactured, in correspondence to the critical current, which will be described later.

With the N-channel MOS transistor 16, the source 16b is connected through contacts 125 and a lead 130 to the grounding conductor 115, and the drain 16c is connected through contacts 135 to a lead 140. The lead 140 is connected through contacts 150 to the drain 18c of the P-channel MOS transistor 18 and connected through a contact 23 to the gate 24a of the P-channel MOS transistor 24. The gate 18a of the P-channel MOS transistor 18 is formed in the same layer as that of the gate 16a of the N-channel MOS transistor 16 and made of the same material (Normally, polysilicon) as that of the gate 16a of the N-channel MOS transistor 16. The gate 18a of the P-channel MOS transistor 18 is connected through the contact 13 to the lead 13 and the resistor 12. The source 18b of the P-channel MOS transistor 18 is connected through the contacts 155 to the electrodes 22, 26. Further, the source 24b of the P-channel MOS transistor 24 is connected through contacts 160 to the electrodes 22, 26, and the drain 24c thereof is connected through contacts 165 to a lead 170. The lead 170 is connected to the internal circuit 30 shown in FIG. 1.

Next, the description will be given to the operation of the semiconductor integrated circuit device according to the present embodiment which is constructed in the manner as described above.

Figure 3:
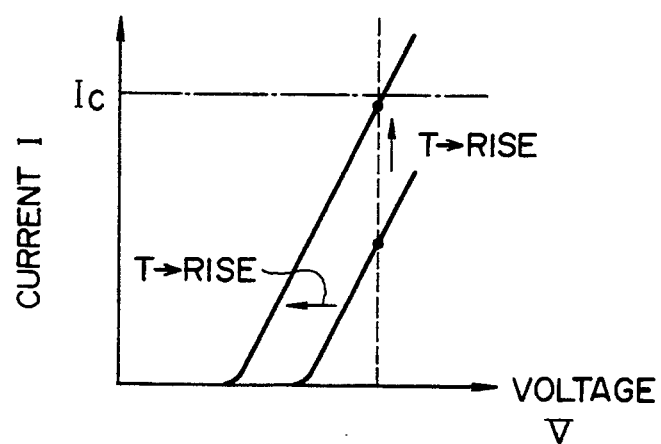
FIG. 3 is a graphical representation showing an example of current-voltage characteristics of a PN junction diode which is used for a temperature sensor in the semiconductor integrated circuit device according to one embodiment of the present invention.

The PN junction diode 11 has current-voltage characteristics as shown in FIG. 3. As seen from FIG. 3, the built-in potential of the PN junction of the PN junction diode 11 is reduced as the junction temperature T of the PN junction diode 11 rises, and as a result, the current flowing through the PN junction is increased.

In FIG. 1, the electric potential $V_Q$ at the anode 11a of the PN junction diode 11, i.e., the contact 13 corresponding to the output portion of the temperature sensor 10 is represented by the following expression;

$$V_Q = v - iR \tag{1}$$

where i represents the current passing through the resistor 12. As seen from the expression (1), the electric potential $V_Q$ is reduced as the current i passing through the resistor 12 is increased due to the rise of the junction temperature T.

Then, when the following relationship is established between the electric potential $V_Q$ and the threshold voltage $V_{T1}$ of the P-channel MOS transistor 18 of the next stage, $$V_{T1} \leq Vcc - V_Q \tag{2}$$

the P-channel MOS transistor 18 is turned on and the N-channel MOS transistor 16 is turned off. As a result, the electric potential Vs at the contact 23 corresponding to the output portion of the inverter 20 is changed from the low level to the high level. As a result, the P-channel MOS transistors 24 of the next stage is turned off thereby to electrically separate the internal circuit 30 from the power source (Vcc), so that the circuit current is stopped.

The threshold voltage $V_{T1}$ of the P-channel MOS transistor 18 is selected as being the same value as that of the internal circuit 30 of the semiconductor integrated circuit device. Then, in the reliability test, during the first aging or burn-in test, the current i with which the semiconductor integrated circuit device according to the present embodiment encapsulated with a certain kind of package begins the latch-up and the like, i.e., the critical current Ic is obtained by monitoring.

Then, since the following relationship is established, $$V_{T1} \leq Vcc - (v - iR) = Vcc - v + iR \tag{3}$$

the circuit current is automatically stopped when the junction temperature T rises up to the certain critical temperature, even if the kind of package is changed, by setting the resistance value R of the resistor so as to satisfy the following expression $$V_{T1} = Vcc - v + IcR \tag{4}$$

As a result, it is possible to prevent the breakdown of the semiconductor integrated circuit device due to the latch-up and the like. Therefore, there is no need for performing the reliability test again.

As described above, according to the present embodiment, the breakdown of the semiconductor integrated circuit device due to the excessive temperature rise can be effectively prevented, and also, even if the kind of package is changed, there is no need for performing the reliability test again, so that only one reliability test with a certain kind of package is available.

In addition, the circuit for stopping the circuit current when the junction temperature T rises up to the critical temperature can be constructed by the MOS transistors and the PN junction diode. Therefore, the semiconductor integrated circuit device according to the present embodiment is suitable for the MOS type semiconductor integrated circuit device.

Although one embodiment of the present invention has been described in detail, modifications may be made without departing from the spirit of the invention.

For example, although the PN junction diode 11 is employed as the temperature sensor in the above-mentioned embodiment, the bipolar transistor may be employed as the temperature sensor.

As set forth hereinabove, according to the present invention, the breakdown of the internal circuit due to the temperature rise can be automatically preventing by the semiconductor integrated circuit device itself. Also, once the reliability test is performed with a certain kind of package, thereafter, the breakdown of the internal circuit can be prevented no matter what kind of package is used. Moreover, the semiconductor integrated circuit device of the present invention is suitable for the MOS type semiconductor integrated circuit device.

We claim:

1. A semiconductor integrated circuit device for controlling a supply of electric energy from a power source to a group of MOS integrated circuit elements in response to a temperature detection output signal for preventing a breakdown of said group of MOS integrated circuit elements, comprising:

a temperature sensor including an element having a PN junction connected between two terminals and a resistor connected to one of the two terminals, in series with said element, for detecting a temperature at said PN junction, thereby generating said temperature detection output signal at the one terminal, the other of the two terminals being connected to a grounding side;

an inverter for receiving said temperature detection output signal and producing an output signal when the PN, junction temperature rises up to a predetermined critical temperature; and switching means connected between the power source and said group of MOS integrated circuit elements for continuing the supply of the electric energy to the group of MOS integrated circuit elements in the absence of the output signal of said inverter and interrupting the supply of the electric energy to the group of MOS integrated circuit elements in the presence of the output signal of said inverter.

2. A semiconductor integrated circuit device according to claim 1, wherein said temperature sensor includes a PN junction diode.

3. A semiconductor integrated circuit device according to claim 1, wherein an opposite end of said resistor is provided at its one end opposite to its other end which is further connected to the power source.

4. A semiconductor integrated circuit device according to claim 3, wherein said resistor includes a resistance wire forming a body of said resistor and a contact which is provided at an intermediate portion of said resistance wire to define a resistance value of said resistor, and said contact is connected to said connection means.

5. A semiconductor integrated circuit device according to claim 4, wherein said resistor is further provided with a bypass for short-circuiting a part of said resistance wire to reduce the resistance value.

6. A semiconductor integrated circuit device according to claim 1, wherein said switching means includes a MOS transistor.

7. A semiconductor integrated circuit device according to claim 1, wherein said inverter includes a pair of MOS transistors.

8. A semiconductor integrated circuit device for controlling a supply of electric energy from a power source to a group of MOS integrated circuit elements in response to a temperature detection output signal for preventing a breakdown of said group of MOS integrated circuit elements, comprising:

a temperature sensor having a PN junction diode connected between two terminals and a variable resistor connected to one of the two terminals, in series with said PN junction diode, for detecting a temperature at said PN junction diode and thereby generating said temperature detection output signal at the one terminal, the other of two terminals being connected to a grounding side;

an inverter for receiving said temperature detection output signal and producing an output signal when the temperature of said junction diode rises up to a predetermined critical temperature, said inverter having a pair of MOS transistors, the temperature detection output signal being inputted to respective gates of said pair of MOS transistors; and switching means for controlling the supply of the electric energy to said group of MOS integrated circuit elements in response to the output signal of said inverter, said switching means including a MOS transistor connected between the power source and said group of MOS integrated circuit elements, the output signal of said inverter being inputted to a gate of said MOS transistor;

wherein said MOS transistor continues the supply of the electric energy to the group of MOS integrated circuit elements in the absence of the output signal of said inverter and cuts off the supply of the electric energy to the group of MOS integrated circuit elements in the response to said inverter output signal.

9. A semiconductor integrated circuit device according to claim 8, wherein said resistor of said temperature sensor is further connected to the power source.

10. A semiconductor integrated circuit device according to claim 9, wherein said resistor includes a resistance wire forming a body of said resistor and a contact which is provided at an intermediate portion of said resistance wire to define a resistance value of said resistor, and said contact is connected to said connection means.

11. A semiconductor integrated circuit device according to claim 10, wherein said resistor is further provided with a bypass for short-circuiting a part of said resistance wire to reduce the resistance value.

12. A semiconductor integrated circuit device according to claim 8, wherein said pair of MOS transistors of said inverter includes a P-channel MOS transistor and an N-channel MOS transistor, and a source of said P-channel MOS transistor is provided with connection means for connecting it to the power source.

13. A semiconductor integrated circuit device according to claim 12, wherein a drain of said P-channel MOS transistor of said inverter and a source of said N-channel MOS transistor thereof are both connected to a gate of said MOS transistor of said switching means.

14. A semiconductor integrated circuit device according to claim 8, wherein said MOS transistor of said switching is a P-channel MOS transistor, and said switching means further includes connection means for connecting a source of said P-channel MOS transistor to the power source.

15. A semiconductor integrated circuit device according to claim 14, wherein a drain of said P-channel MOS transistor of said switching means is connected to said group of MOS integrated circuit elements.

16. A semiconductor integrated circuit device for controlling a supply of electric energy from a power source to a group of MOS integrated circuit elements in response to a temperature detection output signal for preventing a breakdown of said group of MOS integrated circuit elements, comprising:

a temperature sensor having a PN junction diode connected between first and second terminals, and a variable resistor connected to the first terminal, in series with said PN junction diode, for detecting a junction temperature of said PN junction diode and thereby generating said temperature detection output signal at the first terminal, said second terminal being connected to a grounding side, said resistor being connected through a third terminal to the power source;

an inverter for receiving the temperature detection output signal said inverter having a pair of P-channel MOS transistors and N-channel MOS transistors, the temperature detection output signal being inputted to respective gates of said MOS transistors, a drain of said P-channel MOS transistor and a drain of said N-channel transistor providing an output signal of said inverter when the PN junction temperature rises to a predetermined critical temperature; and switching means for controlling the supply of the electric energy to said group of MOS integrated circuit elements on a basis of the output signal of said inverter, said switching means including a P-channel MOS transistor connected between the power source and said group of MOS integrated circuit elements, the output signal of said inverter being inputted to a gate of said P-channel MOS transistor, a drain of said P-channel MOS transistor being connected to said group of MOS integrated circuit elements;

wherein said P-channel MOS transistor continues the supply of the electric energy to the group of MOS integrated circuit elements in the absence of the output signal of said inverter and cuts off the supply of the electric energy to said group of MOS integrated circuit elements in the presence said inverter output signal.

17. A semiconductor integrated circuit device according to claim 16, wherein a source of said P-channel MOS transistor of said inverter is further provided with a connection terminal for connecting it to a power source.

18. A semiconductor integrated circuit device according to claim 16, wherein a source of said P-channel MOS transistor of said switching means is further provided with a connection terminal for connecting it to a power source.

19. A semiconductor integrated circuit device according to claim 16, wherein said resistor includes a resistance wire forming a body of said resistor and a contact which is provided at an intermediate portion of said resistance wire to define a resistance value of said resistor, and said contact is connected to said third terminal.

20. A semiconductor integrated circuit device according to claim 19, wherein said resistor is further provided with a bypass for short-circuiting a part of said resistance wire to reduce the resistance value.

* * * * *